United States Patent
Narutaki et al.

(10) Patent No.: US 10,547,026 B2
(45) Date of Patent: Jan. 28, 2020

(54) DISPLAY APPARATUS

(71) Applicants: Sakai Display Products Corporation, Osaka (JP); Sharp Corporation, Osaka (JP)

(72) Inventors: Yozo Narutaki, Osaka (JP); Katsuhiko Kishimoto, Osaka (JP); Shinji Shimada, Osaka (JP); Masahiro Mitani, Osaka (JP); Kohzoh Nakamura, Osaka (JP); Kiyoshi Minoura, Osaka (JP); Hiroshi Tsuchiya, Osaka (JP); Yuhki Kobayashi, Osaka (JP); Shinichi Kawato, Osaka (JP)

(73) Assignees: Sakai Display Products Corporation, Osaka (JP); Sharp Corporation, Osaka (JP)

( * ) Notice: Subject to any disclaimer, the term of this patent is extended or adjusted under 35 U.S.C. 154(b) by 0 days.

(21) Appl. No.: 16/065,630

(22) PCT Filed: Mar. 31, 2017

(86) PCT No.: PCT/JP2017/013598
§ 371 (c)(1),
(2) Date: Aug. 8, 2018

(87) PCT Pub. No.: WO2018/179334
PCT Pub. Date: Oct. 4, 2018

(65) Prior Publication Data
US 2019/0355928 A1    Nov. 21, 2019

(51) Int. Cl.
*H01L 51/52* (2006.01)
*H01L 27/32* (2006.01)
*G02F 1/1335* (2006.01)

(52) U.S. Cl.
CPC .... *H01L 51/5253* (2013.01); *G02F 1/133528* (2013.01); *G02F 1/133553* (2013.01);
(Continued)

(58) Field of Classification Search
CPC ............. H01L 27/3232; H01L 27/3258; H01L 51/5253; H01L 51/5246; G02F 1/133528; G02F 1/133553
See application file for complete search history.

(56) References Cited

U.S. PATENT DOCUMENTS

2003/0052869 A1   3/2003   Fujii et al.
2003/0193457 A1   10/2003  Wang et al.
(Continued)

FOREIGN PATENT DOCUMENTS

JP   2002140022 A   5/2002
JP   2002196702 A   7/2002
(Continued)

OTHER PUBLICATIONS

PCT International Search Report, PCT Application No. PCT/JP2017/013598, Japan Patent Office. dated Jun. 20, 2017.
(Continued)

*Primary Examiner* — Nathanael R Briggs
(74) *Attorney, Agent, or Firm* — Snell & Wilmer LLP

(57) ABSTRACT

A reflective liquid crystal display device (30) including a reflection electrode (31), a liquid crystal layer (32), and a counter electrode (33) is formed above an insulating layer (25) in a first region (R) of a TFT substrate (20). An organic EL display device (40) including a first electrode (41), an organic layer (43), and a second electrode (44) is formed on the insulating layer (25) of the TFT substrate (20) in a second region (T). A coating layer (45) is formed at least on a surface of the organic EL display device (40) so as to wrap the second electrode (44) and the organic layer (43) of the organic EL display device (40). A part of the coating layer (45) is in contact with the insulating layer (25). As a result, a complex display apparatus capable of preventing the organic layer from deteriorating and excellent in reliability can be obtained.

9 Claims, 10 Drawing Sheets

(52) U.S. Cl.
CPC ...... *H01L 27/3232* (2013.01); *H01L 27/3258* (2013.01); *H01L 51/5246* (2013.01)

(56) References Cited

U.S. PATENT DOCUMENTS

| | | | |
|---|---|---|---|
| 2006/0072047 A1* | 4/2006 | Sekiguchi | G02F 1/1335 349/25 |
| 2011/0001146 A1 | 1/2011 | Yamazaki et al. | |
| 2017/0162636 A1* | 6/2017 | Park | H01L 27/3262 |

FOREIGN PATENT DOCUMENTS

| | | |
|---|---|---|
| JP | 2003157029 A | 5/2003 |
| JP | 2003316295 A | 11/2003 |
| JP | 2005352253 A | 12/2005 |
| JP | 3898012 B2 | 3/2007 |
| JP | 2007108771 A | 4/2007 |
| JP | 2011029176 A | 2/2011 |
| WO | 2004053819 A1 | 6/2004 |

OTHER PUBLICATIONS

English Translation of PCT International Search Report, PCT Application No. PCT/JP2017/013598, Japan Patent Office. dated Jun. 20, 2017.

* cited by examiner

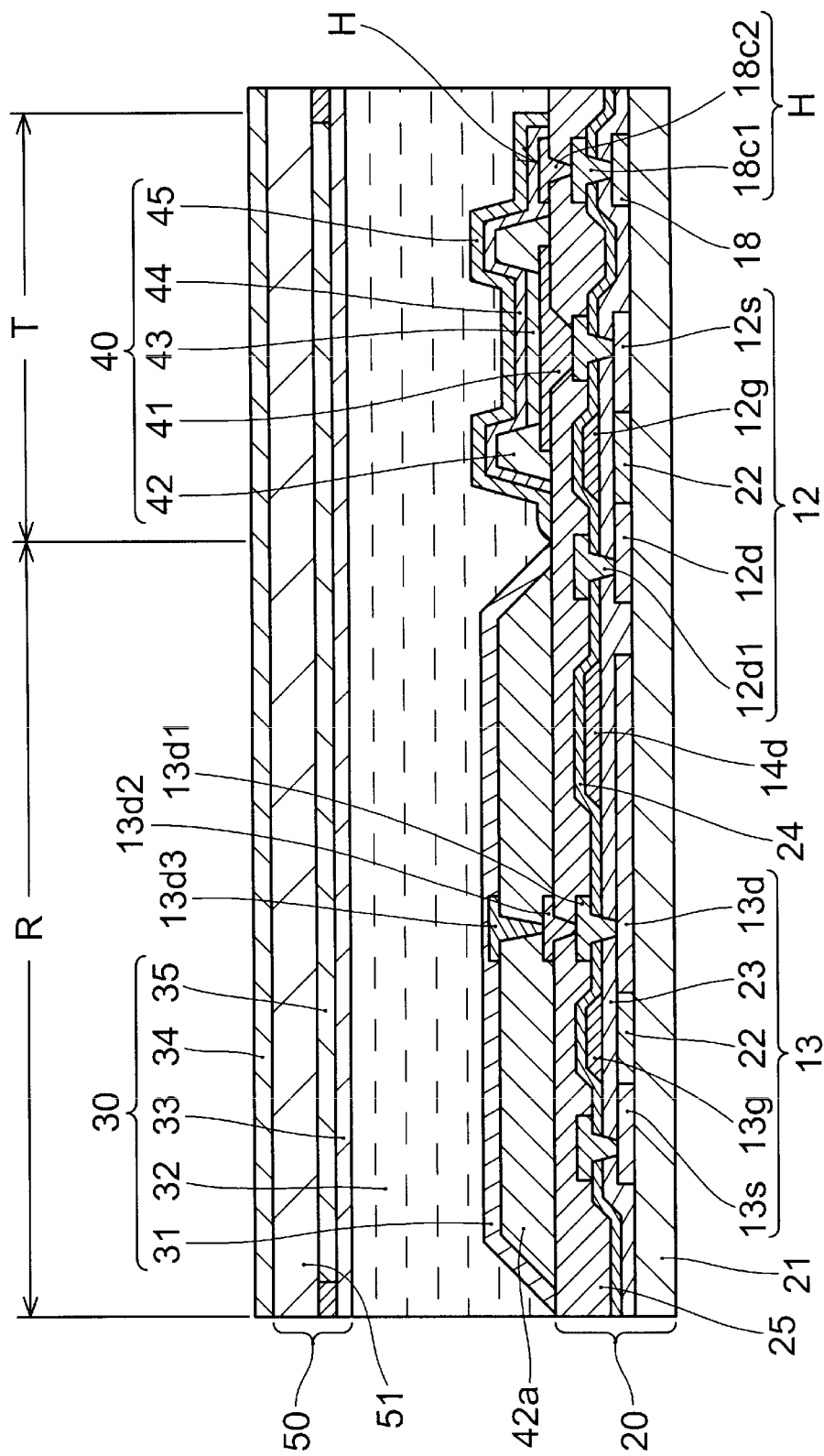

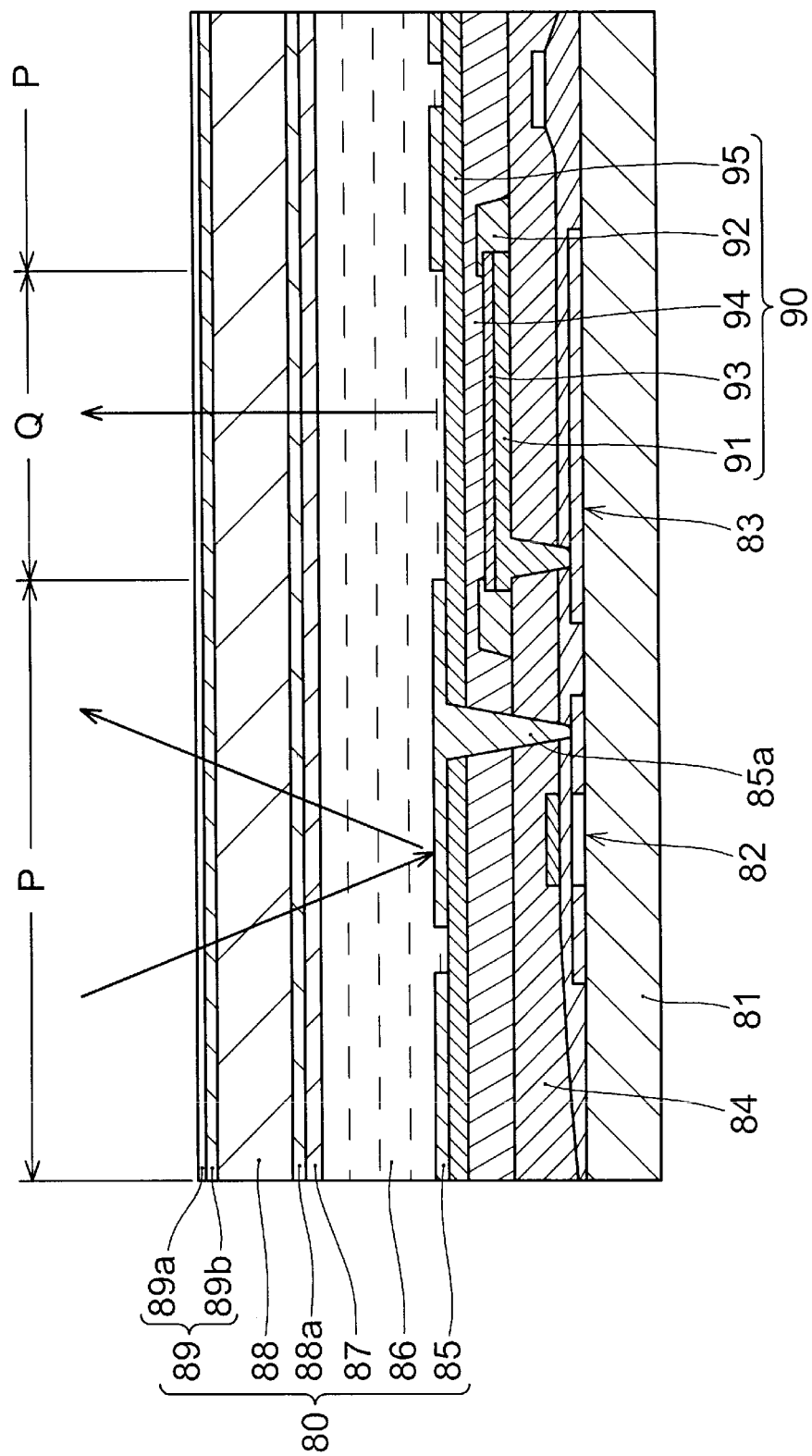

DISPLAY APPARATUS

CROSS-REFERENCE TO RELATED APPLICATIONS

This patent application is a U.S. National Stage of Inernational Application No. PCT/JP2017/013598, filed on Mar. 31, 2017 (expired).

TECHNICAL FIELD

The disclosure relates to a complex (hybrid) display apparatus, which combines a reflective liquid crystal display device and an organic EL display device.

BACKGROUND ART

In recent years, the portable equipment has been widely spread as represented by portable telephones and personal digital assistants (PDA). The portable equipment particularly requires lowness in power consumption. From this reason, for example, a reflective liquid crystal display device may be employed because it has no backlight and uses external light. However, in the reflective liquid crystal display device or any other display device using external light, there is a problem that display is infeasible in the night, or even indoors if available external light is insufficient. Therefore, a display apparatus using an organic EL display device lower in electric power consumption in addition to the reflective liquid crystal display device is conventionally proposed (for example, refer to Patent Document 1).

FIG. 5 is a cross-sectional view illustrating an exemplary structure of the above-mentioned display apparatus. More specifically, a TFT 82 for a liquid crystal display device, a TFT 83 for an organic EL display device, and bus lines (not illustrated) are formed on an insulating substrate 81. A flattening layer 84 is formed on surfaces of these members. The display apparatus includes a reflective region P and a transmissive region Q, which are divided as illustrated in FIG. 5. In the transmissive region Q, a light reflective anode electrode 91 for an organic EL display device 90 is formed on the flattening layer 84. The transmissive region Q further includes an insulating layer 92, an organic layer 93, a cathode electrode 94, and a transparent insulating layer 95 formed so as to constitute the organic EL display device 90. On the other hand, the reflective region P includes a reflection electrode (pixel electrode) 85, a liquid crystal layer 86, a counter electrode 87, and a counter substrate 88 provided on the transparent insulating layer 95. Further, a polarizing plate 89 is formed on an outer surface thereof so as to constitute a reflective liquid crystal display device 80. According to the illustrated example, the polarizing plate 89 includes a linear polarizing plate 89a and a quarter-wavelength retardation plate 89b, which are laminated to constitute a circularly polarizing plate. In this arrangement, the cathode electrode 94 and the transparent insulating layer 95 of the organic EL display device 90 are present also in the reflective region P. The liquid crystal layer 86, the counter electrode 87, the counter substrate 88, and the polarizing plate 89, constituting the liquid crystal display device 80, are formed so as to extend into the transmissive region Q. Further, a color filter layer 88a intervenes between the counter electrode 87 and the counter substrate 88.

PRIOR ART DOCUMENT

Patent Document

Patent Document 1: Japanese Patent No. 3898012

SUMMARY

Problem to be Solved by the Invention

The above-mentioned conventional complex display apparatus includes the reflective liquid crystal display device 80 and the organic EL display device 90, which are combined together. The organic EL display device 90 includes the cathode electrode 94 and the transparent insulating layer 95, which are respectively formed so as to extend into the liquid crystal display device region. The liquid crystal display device 80 includes the liquid crystal layer 86, the counter electrode 87, the counter substrate 88, and the polarizing plate 89, which are respectively formed so as to extend into the organic EL display device region. The reason why the above-mentioned members are formed to extend from one display device region to the other display device region is believed that there is no substantial adverse effect and forming the liquid crystal layer 86 only in the reflective region P of the liquid crystal display device 80 is difficult. It is further believed that the thickness of the liquid crystal layer 86 is desirably the same between the reflective region P and the transmissive region Q and an underlying layer is required to have substantially the same height. Therefore, it is believed that the cathode electrode 94 for the organic EL display device 90 and the transparent insulating layer 95 formed on its surface are formed even in the reflective region P of the liquid crystal display device 80.

However, the above-mentioned complex display apparatus are that the organic EL display device 90 has problems of a short life and its performances, such as output, tend to deteriorate within a short time. An intensive investigation by the present inventors examining the cause of the problems has revealed that there is insufficiency in preventing infiltration of moisture although the insulating layer 95 formed of an inorganic layer such as tantalum pentoxide is formed on the outermost surface of the organic EL display device 90 to prevent the infiltration of moisture.

To solve such problems, the disclosure intends to provide a complex display apparatus that includes a liquid crystal display device and an organic EL display device, in which a protection layer is provided to cover the cathode electrode and an organic layer of the organic EL display device so as to constitute a structure capable of preventing the infiltration of moisture into the organic layer.

Means to Solve the Problem

A display apparatus according to an embodiment of the disclosure comprises a TFT substrate including an insulating layer formed on a driving element; a liquid crystal layer including a liquid crystal composition; a counter substrate provided with a transparent electrode facing the TFT substrate via the liquid crystal layer; and a polarizing plate provided on a surface of the counter substrate, the surface being opposite to the liquid crystal layer, wherein the display apparatus includes a plurality of pixels, each of the plurality of pixels including a first region and a second region, the first region and the second region being adjacent to each other, in a display region, the first region has a reflection electrode provided above the insulating layer of the TFT substrate, the second region has a light emitting device, the light emitting device being provided with a first electrode, an organic layer, and a second electrode are in order on the insulating layer of the TFT substrate, the light emitting device further includes a coating layer covering entirely a light emitting region of each pixel, and wherein a border part of the coating layer is in contact with the insulating layer.

Effects of the Invention

According to an embodiment of the disclosure, the organic EL display device is configured to cover the second electrode and the organic layer with the coating layer, and therefore the infiltration of the moisture into the organic layer can be prevented.

BRIEF DESCRIPTION OF THE DRAWINGS

FIG. 1A is a cross-sectional view illustrating a display apparatus according to an embodiment of the disclosure.

FIG. 5 is a cross-sectional view illustrating a conventional complex display apparatus combining a liquid crystal display device and an organic EL display device.

EMBODIMENT FOR CARRYING OUT THE INVENTION

Hereinafter, a display apparatus according to a first embodiment of the disclosure will be described in detail with reference to attached drawings. FIG. 1A is a schematic cross-sectional view illustrating a part, corresponding to one pixel, of the display apparatus according to the embodiment. FIG. 2 illustrates an equivalent circuit of a driving element portion illustrated in FIG. 1A. FIGS. 3A to 3G and FIGS. 4A to 4G are cross-sectional views and plan views, each illustrating a manufacturing process of the display apparatus.

Figure 1B:
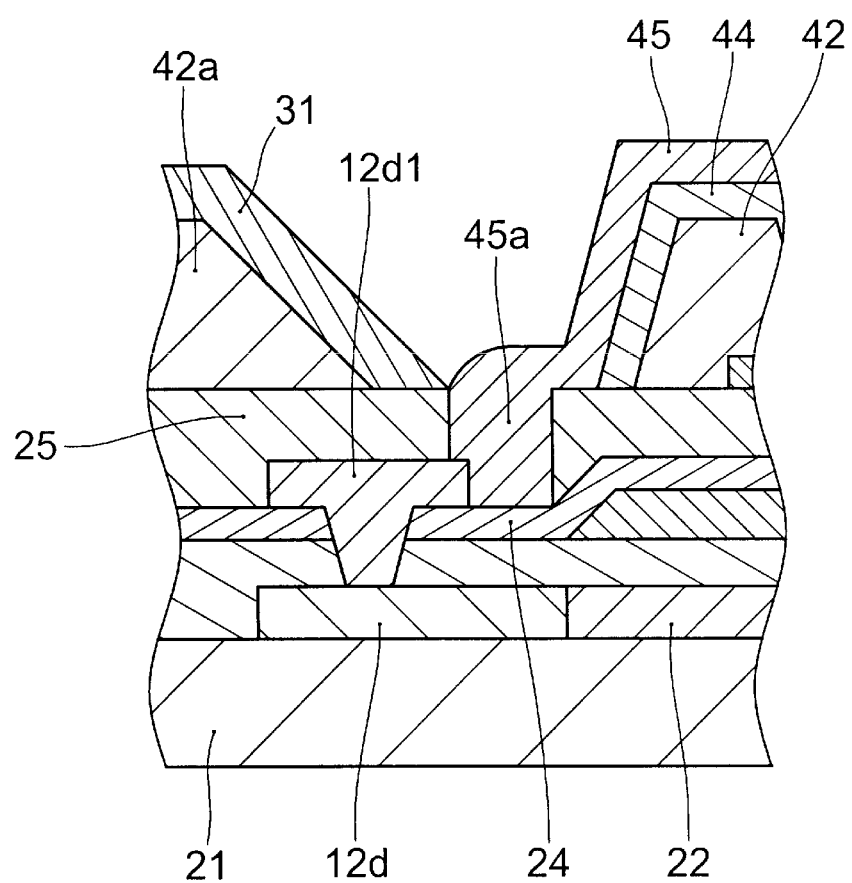
FIG. 1B is a partly enlarged view illustrating a modified example of a joint portion where a coating layer and an insulating layer illustrated in FIG. 1A are in contact.
Figure 2:
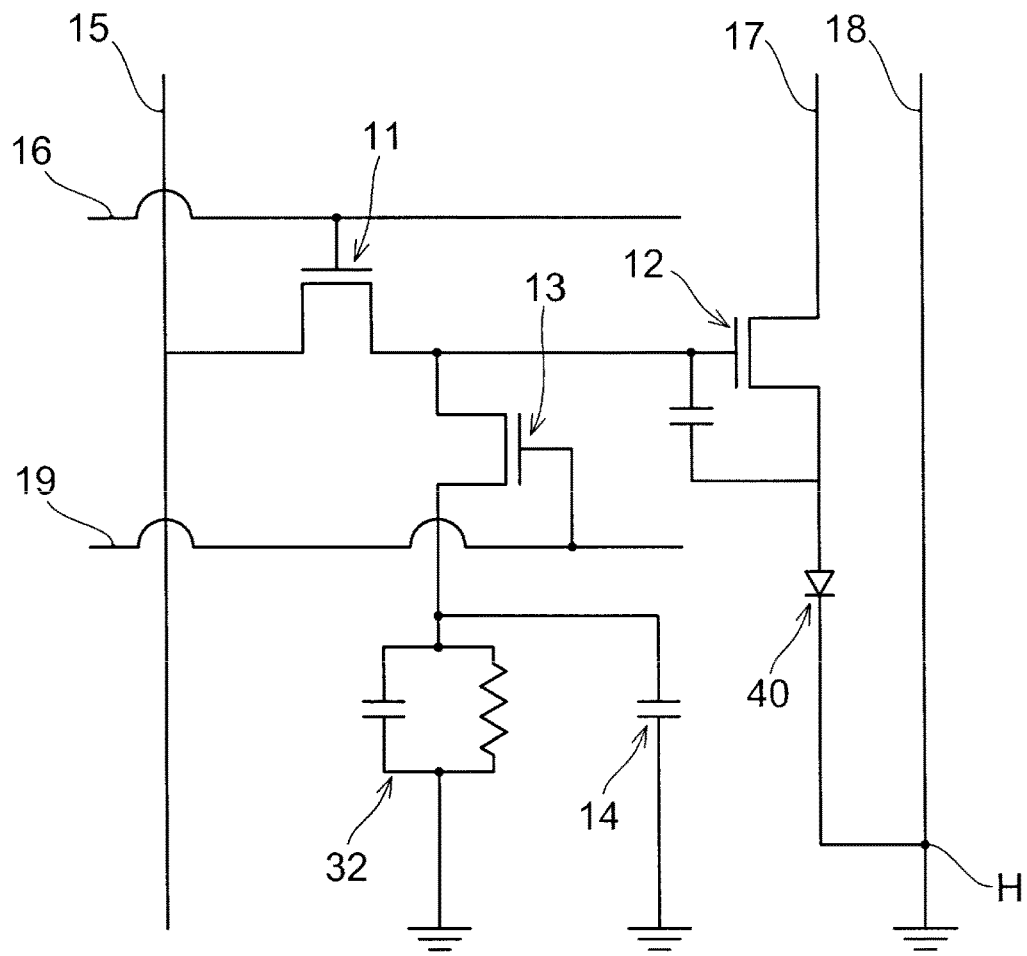
FIG. 2 is an equivalent circuit diagram illustrating an exemplary arrangement of TFTs and wiring formed on a TFT substrate illustrated in FIG. 1.

As illustrated in the cross-sectional views of FIGS. 1A and 1B, the display apparatus according to an embodiment of the disclosure includes a TFT substrate 20 including an insulating layer (so-called flattening layer) 25 formed on a driving element 13, a liquid crystal layer 32 including a liquid crystal composition, a counter substrate 50 provided with a transparent electrode 33 facing the TFT substrate 20 via the liquid crystal layer 32, and a polarizing plate 34 provided on a surface of the counter substrate 50, which is a surface opposite to a surface facing the liquid crystal layer 32. The display apparatus includes a plurality of pixels, each of which includes a first region R and a second region T that are adjacent to each other, in a display region. A reflection electrode 31 is provided above the insulating layer 25 of the TFT substrate 20 in the first region R. A light emitting device 40 which includes a first electrode 41, an organic layer 43, and a second electrode 44, is provided on the insulating layer 25 of the TFT substrate 20 in the second region T. The light emitting device 40 further includes a coating layer 45 that entirely covers the light emitting device of each pixel, and a border part of the coating layer 45 is contact with the insulating layer 25.

More specifically, the display apparatus according to the present embodiment includes the reflective liquid crystal display device 30 formed in the first region R of one pixel, and further includes the light emitting device 40, such as the organic EL display device, formed in the second region T neighboring the first region R of one pixel. The reflection electrode 31, the liquid crystal layer 32, the transparent electrode 33, and the polarizing plate 34 constitute the reflective liquid crystal display device 30. The liquid crystal layer 32, the counter substrate 50 including the transparent electrode 33, and the polarizing plate 34 extend into the second region T so as to be entirely formed in the display apparatus. The light emitting device 40 includes the first electrode 41, a second insulating layer 42 that is referred to as a so-called insulation bank defining a light emitting region, the organic layer 43, the second electrode 44, and the coating layer 45 that coats surroundings thereof. A part of the second insulating layer is formed on the insulating layer 25 of the first region R, which is formed of the same material and having the same thickness as the second insulating layer 42 of the second region T. However, the second insulating layer in the first region R is separated from the second insulating layer 42 referred to as the so-called insulation bank in the second region T. Therefore, the second insulating layer in the first region R is distinctively referred to as a third insulating layer 42a. The present embodiment is characterized in that the coating layer 45 of the light emitting device 40 is provided so as to cover the organic layer 43 and the second electrode 44 of the light emitting device 40 and a border part thereof is in contact with the insulating layer 25.

In the present embodiment, the border part indicates a peripheral region of a surface extending toward the insulating layer 25 so as to be in contact with the insulating layer 25. For example, the border part is an edge region of the coating layer 45 as illustrated in FIG. 1A. Although not illustrated, the border part may be an intermediate portion of the coating layer 45 to be in contact with the insulating layer 25 when the coating layer 45 is formed so as to extend toward the third insulating layer 42a of the first region R. In short, the border part indicates a leading part of the coating layer 45 directed toward an exposed portion of the insulating layer 25.

As mentioned above, the present inventors have found that the conventional display apparatus illustrated in FIG. 5 is inferior in that the organic layer 93 tends to deteriorate due to the infiltration of moisture although the transparent insulating layer 95 made of the inorganic layer is formed on the surface thereof. Further, as a result of intensive investigation, the present inventors have found that the conventional structure illustrated in FIG. 5 is inferior in that the infiltration of moisture occurs in a process for forming a contact 85a that connects the reflection electrode (pixel electrode) 85 of the liquid crystal display device 80 and a drain of the TFT 82 for the liquid crystal display device 80. More specifically, forming the contact 85a requires forming a contact hole penetrating both the transparent insulating layer 95 and the cathode electrode 94. The process for forming the contact hole facilitates the infiltration of moisture and causes the moisture to reach the organic layer 93 and deteriorate the organic layer 93. In particular, although Mg—Ag having light transmitting properties is a representative material for the cathode electrode 94, the cathode electrode 94 of the light emitting device 40 is easily corroded by moisture irrespective of its material. The corrosion generated by the formation of the contact hole spreads over the entire layer of the cathode electrode 94 and deteriorates the organic layer 93.

Although an exemplary configuration of the light emitting device 40 (hereinafter, referred to as "organic EL display device 40") is described in detail below, in the present embodiment, as illustrated in FIG. 1A, the second electrode (cathode electrode) 44 of the organic EL display device 40 is formed as an upper layer of the organic EL display device 40 in the second region T. Both the organic layer 43 and the second electrode 44 are wrapped with the coating layer (TFE; thin film encapsulation) 45. The coating layer (TFE) 45 wraps the second electrode 44 and the organic layer 43, and has at least a border part in contact with the insulating layer 25. More specifically, as described in detail below, the coating layer 45 is made from an inorganic insulating layer, such as a silicon nitride layer or a silicon oxide layer, and in contact with the insulating layer 25. In short, wrapping the organic layer 43 and the second electrode 44 with the coating layer 45 means that the coating layer 45 completely surrounds them and means that there is no through hole for the contact as shown in Patent Document 1. Therefore, the organic layer 43 and the second electrode 44 of the organic EL display device 40 according to the present embodiment are completely blocked and protected from being exposed to the outside. This is the characteristics of the present embodiment.

The contact between the coating layer 45 and the insulating layer 25 may be formed in contact with the surface of the insulating layer 25, as illustrated in FIG. 1A. In particular, as described in detail below, the insulating layer 25 is preferably made from an inorganic insulating layer, which is the same kind of material as the coating layer 45 made of an inorganic material, because completely adhesion will be expected and the infiltration of moisture can be prevented even if the contact is limited only on the surface of the insulating layer 25. Even when the insulating layer 25 is made from an organic layer, such as polyimide, the organic EL display device 40 can be waterproofed if the contact area is sufficiently larger.

However, as understood from the partially enlarged view illustrated in FIG. 1B, forming a groove (a trench) in the insulating layer 25 and partly embedding the coating layer 45 in the groove is desired, because the contact area can be increased. More specifically, partly embedding the coating layer 45 in the groove as described above can be in contact with the coating layer 45 and the insulating layer 25 on an inner wall of the groove. Accordingly, the depth of the contact portion becomes larger. Increasing the depth of the partly embedded coating layer 45 is desired in that the path of the contact surface becomes longer. In particular, as illustrated in FIG. 1B, forming the embedded coating layer 45 so as to be in contact with a metal layer (a contact 12d1 or a wiring metal layer) or an inorganic insulating layer (a passivation layer 24), which is located beneath the insulating layer 25, is desired.

Further, it is desired that forming the border part of the coating layer 45 is formed on a wide flat portion, such as the passivation layer 24 on an electrode 14d of an auxiliary capacitance 14, because the contact between the inorganic layers each other brings effects of enhancing the adhesion and preventing the infiltration of moisture, as mentioned above. For example, a structure for bringing the border part of the coating layer 45 into contact with the passivation layer 24 on the auxiliary capacitance electrode 14d (see FIG. 1A) in the first region R may be employed to realize the contact between the inorganic layers. More specifically, there is no problem even when the coating layer 45 underlies the reflection electrode 31, as long as there is no contact hole at the place where the coating layer 45 is formed. As apparent from a manufacturing method described in detail below, forming the coating layer 45 precedes forming the reflection electrode 31.

As mentioned above, it is most desirable that the sealing is realized by the adhesion between the inorganic layers. However, the present embodiment is not limited to the above-mentioned contact between the inorganic layers. Contact between the coating layer 45 and the insulating layer 25, or embedding the edge region of the coating layer 45 into the groove formed in the insulating layer 25 (contact on a side surface of the groove), is another example of the present embodiment. Increasing the depth of the groove brings desirable effects in embedding the coating layer 45 partly into the groove, although the depth is not specifically limited.

As mentioned above, it is desired that the thickness of the liquid crystal layer 32 be not so different between the first region R and the second region T. Therefore, as illustrated in FIG. 1A, forming the second insulating layer 42 pertitioning the light emitting region of the organic EL display device 40 is accompanied by forming an insulating layer made of the same material as the second insulating layer 42 in the first region R. However, according to the example illustrated in FIG. 1A, the second insulating layer 42 is split at a boundary region between the first region R and the second region T, and the insulating layer 25 is exposed at the boundary region. The coating layer 45 is in contact with the exposed surface of the insulating layer 25. The insulating layer located in the first region R, made of the same material as the second insulating layer 42, is referred to as a third insulating layer 42a. As mentioned above, forming the third insulating layer 42a in the first region R can expose the insulating layer 25 by splitting the second insulating layer 42 from the third insulating layer 42a, and can facilitate the contact between the coating layer 45 and the insulating layer 25, while bringing the height of the lower layer of the liquid crystal layer 32 closer between two regions R and T (strictly speaking, there is a difference of approximately 1 μm in the thickness of the coating layer 45). As a result, the coating layer 45 can easily seal the organic layer 43 and the second electrode 44. The boundary between the second insulating layer 42 and the third insulating layer 42a is not limited to the boundary region between the first region R and the second region T. The above-mentioned splitting can be performed anywhere as long as the portion where a contact hole for a contact 13d3 is formed is positioned on the third insulating layer 42a side, as mentioned above.

(TFT Substrate 20)

The TFT substrate 20 includes a driving thin film transistor (hereinafter, simply referred to as TFT) 11, a current supply TFT 12, a switching TFT 13 (see FIG. 2) and wiring including bus lines, which are formed on a surface of an insulation substrate 21 made from a glass substrate or a resin film, such as polyimide. The TFT substrate 20 further includes the insulating layer 25, i.e., a so-called flattening layer, for flattening the surface thereof. The insulating layer 25 is preferably formed of an organic material, such as polyimide, because it intends to flatten the surface by eliminating unevenness between a portion where the TFT or the like is formed and a portion where the TFT or the like is not formed. However, as mentioned above, when contact with the coating layer 45 for sealing is taken into consideration, the insulating layer 25 may be formed of an inorganic material. If the insulating layer 25 is formed of $SiO_y$, $SiN_x$, or comparable inorganic material, according to the CVD method, the thickness required for the flattening is several µm. Therefore, the layer forming time becomes longer. However, spin-on-glass (SOG) may be usable to facilitate the flattening. In the example illustrated in FIG. 1A, the element structure is conceptual and respective elements are not precise.

An exemplary circuit for driving the liquid crystal display device 30 and the organic EL display device 40 has a configuration of the equivalent circuit illustrated in FIG. 2. More specifically, the driving TFT 11 has a gate connected to a gate bus line 16. Applying a gate signal (a selection signal) to the gate bus line 16 can select a row of pixels aligned horizontally. Further, the driving TFT 11 has a source connected to a source bus line 15 so that a data signal can be input to a column of pixels aligned vertically. The circuit is configured to display only a pixel positioned on a crossing point of the gate bus line 16 to which the selection signal is given and the source bus line 15 to which the data signal is given based on the data signal. The driving TFT 11 has a drain connected to a gate of the current supply TFT 12, so as to control the current flowing the organic EL display device 40 according to display information. Further, the drain of the driving TFT 11 is connected, via the switching TFT 13, to the liquid crystal layer 32 and the auxiliary capacitance 14 for the liquid crystal. In FIG. 2, a capacitor and a resistor are connected in parallel with each other to constitute an equivalent circuit, as an electrical expression of the liquid crystal layer 32. The auxiliary capacitance 14 connected in parallel with the liquid crystal layer 32 is configured to hold the voltage of the reflection electrode 31 at the time of active matrix display scanning.

A second gate bus line 19 is connected to a gate of the switching TFT 13, so as to control ON/OFF of the operation of the switching TFT 13. The switching TFT 13 has a source connected to the drain of the driving TFT 11, namely, the gate of the current supply TFT 12. The current supply TFT 12 has a drain connected to a current bus line 17 and a source connected to an anode electrode of the organic EL display device 40. The cathode electrode 44 of the organic EL display device 40 is connected to a cathode bus line 18 at a contact H (18c1, 18c2).

The switching TFT 13 is provided for switching between display by the liquid crystal display device 30 and display by the organic EL display device 40. More specifically, in a state where a pixel is selected by the driving TFT 11, if the switching TFT 13 is turned on in response to a signal given to the second gate bus line 19 connected to the gate of the switching TFT 13, the source bus line 15 is connected to the liquid crystal layer 32 and the liquid crystal display device 30 displays an image. When the switching TFT 13 in an ON state, the current bus line 17 is turned off so as to prevent current from flowing through the current supply TFT 12. When selecting the driving TFT 11 and turning off the switching TFT 13 the driving TFT 11 disconnects to the liquid crystal layer 32, and turning on the current supply TFT 12 causes the organic EL display device 40 to display an image.

The switching TFT 13 is provided for enabling each of the liquid crystal display device 30 and the organic EL display device 40 to be independently driven. More specifically, in many cases, the organic EL display device 40 has a wide color reproduction range of 100% in NTSC ratio. On the other hand, in many cases, the reflective liquid crystal display device 30 is designed to have a narrow color reproduction range to realize brighter display. Therefore, simultaneously activating the liquid crystal display device 30 and the organic EL display device 40 hinders the display of the organic EL display device 40. This is the reason why the liquid crystal display device 30 does not operate when the organic EL display device 40 operates.

(Liquid Crystal Display Device 30)

The liquid crystal display device 30 is a reflective liquid crystal display device constituted by the reflection electrode 31, the liquid crystal layer 32, the counter electrode 33, and the polarizing plate 34, which are formed on the entire area of the first region R occupying approximately a half of one pixel. Forming the liquid crystal layer 32 only in the first region R is difficult, and therefore the liquid crystal layer 32 and the counter electrode 33 are formed on the entire area of the first region R and the second region T. According to the example illustrated in FIG. 1A, a color filter 35 is formed between an insulation substrate 51 of the counter substrate 50 and the counter electrode 33. Although not illustrated, a liquid crystal alignment layer is formed on a surface of the counter substrate 50, which is in contact with the liquid crystal layer 32.

The reflection electrode 31 is a so-called pixel electrode formed in such a way as to range substantially the entire area of the first region R. The reflection electrode 31 is formed on the third insulating layer 42a in the first region R. The third insulating layer 42a is formed simultaneously with and using the same material as the second insulating layer 42 serving as the insulation bank for pertitioning the light emitting region of the organic EL display device 40 in each pixel of the organic EL display device 40 described below. The reflection electrode 31 is connected to a drain 13d of the above-mentioned switching TFT 13 via the contact 13d3 formed in the third insulating layer 42a, a contact 13d2 formed in the insulating layer 25, and a contact 13d1. The reflection electrode 31 is formed as complex layers constituted by an aluminum (Al) layer having a thickness, for example, not less than 0.05 µm and not greater than 0.2 µm and an indium zinc oxide (IZO) layer having a thickness, for example, not less than 0.01 µm and not greater than 0.05 µm.

The liquid crystal layer 32 includes the liquid crystal composition containing a desired liquid crystal material. For example, a liquid crystal material applicable to various display modes, including electrically controlled birefringence (ECB) mode, may be used. A guest/host type liquid crystal material may be used if display is performed without providing any polarizing plate. The liquid crystal layer 32 and the polarizing plate 34 cooperatively block or pass incoming light, for each pixel, according to voltage ON/OFF between both electrodes of the reflection electrode 31 and the counter electrode 33. In the ECB mode, it is desired to set a thickness capable of causing a phase difference of quarter wavelength, at the timing of voltage on, while the light passes the liquid crystal layer 32 and reaches the reflection electrode 31. Liquid crystal alignment layers (not illustrated) are formed on both surfaces of the TFT substrate 20 and the counter substrate 50, more specifically, on the outermost surface of the TFT substrate 20 facing the liquid crystal layer 32 and the outermost surface of the counter substrate 50 facing the liquid crystal layer 32. The liquid crystal alignment layer regulates the alignment of liquid crystal molecules, and the oriented direction thereof can be regulated by ultraviolet light irradiation or rubbing processing.

The liquid crystal alignment layer can control the alignment of the liquid crystal layer, for example, in such a manner that liquid crystal molecules are aligned vertically in a state where no voltage is applied to both surfaces of the liquid crystal layer 32. Such a control can realize black display, namely, normally black, while preventing reflected light of external light from going outside in a state where a voltage exceeding a threshold is not applied between the reflection electrode 31 and the counter electrode 33, as described in detail below. In this case, in the TFT substrate 20 since the organic EL display device 40 is formed under the liquid crystal alignment layer, it is difficult to perform the rubbing processing or ultraviolet light irradiation. Therefore, a pretilt (gradient) angle is not formed, and substantially vertical alignment can be realized. However, it is desired to form a pretilt angle of 80° to 89.9° in the liquid crystal alignment layer on the counter substrate 50 side. Forming the pretilt angle as mentioned above enables liquid crystal molecules in a central region in the cell thickness direction to easily shift into horizontal alignment, when a voltage is applied between both electrodes.

According to the example illustrated in FIG. 1A, the polarizing plate 34 is a circularly polarizing plate, which can be formed by combining a linearly polarizing plate and a quarter-wavelength retardation plate. Further, in some cases, a half-wavelength plate may be used in combination so as to demonstrate quarter-wavelength conditions in a wider range of wavelengths. A uniaxially stretched optical film constitutes the retardation plate. Light having passed through the circularly polarizing plate is, for example, right polarized light having a phase shifted by a quarter wavelength compared to linearly polarized light. As mentioned above, if a voltage exceeding the threshold is not applied between the reflection electrode 31 and the counter electrode 33 provided of both surfaces of the liquid crystal layer 32, and the liquid crystal layer 32 is vertical aligned, external light will directly pass through the liquid crystal layer 32 and will be reflected by the reflection electrode 31, thereby causing the polarized light to change from right circularly polarized light to left circularly polarized light. Accordingly, the external light returning to the circularly polarizing plate 34 by reversing the incoming direction becomes linearly polarized light having an angle orthogonal to the transmission axis of the linearly polarizing plate and unable to pass through the polarizing plate 34, thereby realizing black display. On the other hand, when a voltage exceeding the threshold is applied to the electrodes on both surfaces of the liquid crystal layer 32, the liquid crystal molecules are aligned horizontally and the phase of the external light is further shifted by a quarter wavelength in the liquid crystal layer 32. Therefore, when reaching the reflection electrode 31, the external light has a phase difference of a half wavelength and is reflected as linearly polarized light. The reflected external light advances along a path opposite to the incoming direction, and therefore passes through the polarizing plate to realize white display. In this embodiment, the polarizing plate 34 is not limited to the circularly polarizing plate and a linearly polarizing plate may be employable depending on the display mode.

As mentioned above, the counter electrode 33 is an electrode common to all pixels for selectively applying a voltage to each pixel of the liquid crystal layer 32. Therefore, the counter electrode 33 is formed so as to cover the entire area of a display screen, and is also formed in the second region T in which the organic EL display device 40 is formed as described below. Since the counter electrode 33 is required to transmit light, the counter electrode 33 is made from a translucent (transparent) conductive layer, such as indium tin oxide (ITO) or indium zinc oxide (IZO).

(Organic EL Display Device)

The organic EL display device 40 is formed in the second region T of each pixel and, as illustrated in FIG. 1A, includes the first electrode 41 formed on the surface of the insulating layer 25 in the second region T, the second insulating layer 42 formed around the first electrode 41, the organic layer 43 formed on the first electrode (anode electrode) 41 surrounded by the second insulating layer 42, the second electrode (cathode electrode) 44 formed so as to cover substantially the entire surface of the organic EL display device, and the coating layer 45 coating the entire area thereof.

The first electrode 41 is, for example, formed as the anode electrode. In the present embodiment, since the display screen is viewed from the upper side of FIG. 1A, the first electrode 41 is formed as a reflection electrode configured to enable all of emitted light to advance upward. Therefore, the material of the first electrode 41 is selectable from light reflective materials in consideration of the work function relationship or the like with respect to the organic layer 43 being in contact with the electrode 41, and so on. For example, complex layers of ITO/APC/ITO are selectable.

The second insulating layer 42, which is also referred to as an insulation bank or a partition wall, is formed in such a way as to define the light emitting region of the organic EL display device 40 and prevent the anode electrode 41 from contacting and conducting the cathode electrode 44. The organic layer 43 is deposited with plurality layers on the first electrode 41 surrounded by the second insulating layer 42. For example, the second insulating layer 42 is made from a resin material, such as polyimide or acrylic resin. As mentioned above, the second insulating layer is also formed in the first region R to equalize the height between the first region R and the second region T. More specifically, a liquid resin is applied on the entire surface and subsequently patterned to form the second insulating layer 42 around the first electrode 41 of the organic EL display device 40 and to form the third insulating layer 42*a* in the first region R. In this case, the present embodiment is characterized in that the insulating layer 25 is exposed by splitting the insulating layer into the second insulating layer 42 on the organic EL display device 40 side and the third insulating layer 42*a* on the liquid crystal display device 30 side. Such an arrangement is convenient for completely covering the organic layer 43 and the second electrode (cathode electrode) 44 of the organic EL display device 40 with the coating layer 45. As mentioned above, the splitting position is not limited to the boundary between the first region R and the second region T and can be any other position as long as the second insulating layer 42 does not include the contact hole. For example, in the example illustrated in FIG. 1A, the splitting can be performed at the position just above the electrode 14d for the auxiliary capacitance 14 to expose the passivation layer 24. In this case, the insulating layer 25 may also be etched to directly expose the passivation layer 24, or a groove may be formed in the insulating layer 25 from the exposed surface of the insulating layer 25. In either case, the coating layer 45 is also in contact with the etched side surface of the insulating layer 25.

The organic layer 43 is deposited on the exposed first electrode 41 surrounded by the second insulating layer 42. Although the organic layer 43 is illustrated as a single layer in FIG. 1A, the organic layer 43 is constituted by a plurality of organic layers made of various materials. Further, the organic layer 43 is weak against moisture and it is infeasible to perform the patterning after forming it on the entire area. Therefore, a vapor-deposition mask is usable for selectively vapor-depositing the evaporated or sublimated organic material only on necessary portions to form the organic layer 43.

More specifically, a hole-injection layer made of a material excellent in matching of ionization energy may be provided, for example, as a layer in contact with the first electrode (anode electrode) 41, to improve hole-injection properties. A hole-transporting layer capable of improving the stable transportation of holes and enabling electrons confinement (energy barrier) into the light emitting layer is formed on the hole-injection layer by using, for example, an amine-based material. Further, a light emitting layer to be selected according to the light emitting wavelength is formed thereon, for example, by doping $Alq_3$ with a red or green organic fluorescent material for red or green color. Further, a DSA-based organic material may be used as a blue-based material. On the other hand, when performing the coloring by using the color filter 35, forming the light emitting layer with the same material as other color pixel is feasible without doping. An electron-transporting layer for further improving the electron injection properties and transporting electrons stably is formed, by using $Alq_3$ or the like, on the light emitting layer. These multi-deposited layers, each having a thickness of several tens of nanometers can form an organic deposition layer 43. In some cases, an electron-injection layer, such as LiF or Liq, capable of improving the electron injection properties may be provided between the organic layer 43 and the second electrode 44. In the present embodiment, the organic layer 43 may include the above-mentioned organic and inorganic layers.

As mentioned above, in the organic deposition layer 43, the light emitting layer may be constituted as an organic layer of a material corresponding to each color of RGB. According to the example illustrated in FIG. 1A, the light emitting layers are formed of the same organic material, and the color filter 35 specifies the color of light emitted. If light emission performances are important, it is desired to separately form the hole-transporting layer and the electron-transporting layer of different materials that are suitable for the light emitting layer. However, in consideration of material costs, there will be cases in which the same material may be commonly used for two or three colors of RGB.

After the organic deposition layer 43 including the electron-injection layer, such as a LiF layer, is formed, the second electrode 44 is formed on the surface thereof. More specifically, the second electrode (e.g., cathode electrode) 44 is formed so as to cover an upper part of the organic EL display device 40. Similar to the above-mentioned bank layer, the second electrode 44 may be formed so as to extend into the first region R, although the place where the contact hole is to be formed is excluded, and it is required to completely cover the second electrode 44 with the coating layer 45. The reason why is that the second electrode 44 is made of a translucent material, such as a thin-film Mg—Ag eutectic film, and is easily corroded by moisture.

The coating layer 45, which is made of an inorganic insulating material, such as $Si_3N_4$ or $SiO_2$, is formed, as a single layer or multiple layers, on the surface of the second electrode 44. For example, the coating layer 45 is preferably a multiple layers constituted by two layers each having a thickness of 0.01 μm to 0.05 μm. The coating layer 45 is preferably formed in multiple layers of different materials. By constituting the coating layer 45 by a plurality of layers, even if some pinholes or the like are present in a layer, it is rare that two or more pinholes perfectly coincide with each other in a different layer, and therefore the coating layer 45 can completely block the outside air. As mentioned above, the coating layer 45 is formed in such a way as to completely cover the organic deposition layer 43 and the second electrode 44. Therefore, the coating layer 45 is in contact with the insulating layer 25 which is at a position lower than the second insulating layer 42.

As mentioned above, in the case that the insulating layer 25 is formed by an inorganic material, as the coating layer 45 is an inorganic insulating layer, the coating layer 45 can be sufficiently in contact with the surface of the insulating layer 25. However, if the insulating layer 25 is an organic layer such as polyimide, the adhesion with the coating layer 45 will deteriorate. Therefore, for example, as illustrated in FIG. 1B, it is desired that a groove (trench) is formed in the insulating layer 25 and a part of the coating layer 45 is embedded into the groove. It should be noted that, for example, when the edge region of the coating layer 45 is extended toward the first region R, the part of the coating layer 45 to be embedded into the groove is not limited to the edge region and includes an intermediate portion other than the edge region if it can be embedded into the insulating layer 25. Needless to say, wrapping the second electrode 44 with the coating layer 45 is required. The embedding of the coating layer 45 into the insulating layer 25 is effective even if it does not penetrate completely and ceases in the middle. However, as illustrated in FIG. 1B, contact of the coating layer 45 to a metal layer or an inorganic insulating layer underlying the insulating layer 25 is effective to improve the adhesion and enhance sealing ability. Even when the embedding is partly, the embedded portion of the coating layer 45 is in contact with the inner wall of the groove of the insulating layer 25.

Forming the organic EL display device 40 completes as mentioned above. As illustrated in FIG. 1A, the liquid crystal layer 32 and the counter electrode 33 are formed also on the organic EL display device 40, because it is difficult to form the liquid crystal layer 32 only in the first region R, as mentioned above. However, only the counter electrode 33 is present, and no electrode corresponding to the reflection electrode (pixel electrode) 31 is present. Therefore, the situation is the same as the above-mentioned case where the voltage applied to both surfaces of the liquid crystal layer 32 is OFF. More specifically, although it is normally black with respect to external light, the light emitted from the organic EL display device 40 passes through the circularly polarizing plate 34 without causing any change because the liquid crystal layer 32 is aligned vertically and the presence of the liquid crystal layer 32 brings no substantial effect. Since the light passing through the circularly polarizing plate 34 can be visually recognized as it is, an image displayed by light emission of the organic EL display device can be visually recognized as it is from the front side.

The light emitted from the organic EL display device 40 is attenuated to a half level, when passing through the circularly polarizing plate 34. However, forming the circularly polarizing plate 34 also in the second region T is desired. The reason is that, when external light enters from the front, the light is reflected by the first electrode 41 of the organic EL display device 40 because the first electrode 41 is made of the light reflective material as mentioned above, and the light goes out of the organic EL display device 40. As a result, it becomes hard to see the display screen. However, providing the circularly polarizing plate 34 can reverse the rotational direction of the circularly polarized light when the light is reflected by the first electrode 41 as mentioned above and prevent the reflected light from passing through the circularly polarizing plate. As a result, the reflected light can be cut off. When the amount of external light is large, the organic EL display device 40 is not operated. However, even when the liquid crystal display device 30 is operating, the occurrence of reflected light is not negligible irrespective of the operational state of the organic EL display device 40. Therefore, even when the liquid crystal display device 30 is operating, the visibility characteristics will greatly deteriorate if the circularly polarizing plate 34 is not present in the second region T.

(Counter Substrate)

The counter substrate 50 includes the color filter 35 and the counter electrode 33 formed, for example, on a substrate such as glass or a transparent (translucent) film. There are various methods for coloring the display screen in the liquid crystal display device 30. The color filter 35 is provided, for each pixel, to form a color pixel of one of three primary colors, red (R), green (G), and blue (B). Even in the organic EL display device 40, as mentioned above, a color filter is usable to realize color display. However, when the material of the organic layer is selected to directly emit light of red (R), green (G), or blue (B), no color filter is necessary. Although not illustrated in the drawing, a liquid crystal alignment layer is formed on a surface of the counter substrate 50 facing the liquid crystal layer 32 and rubbing processing or the like is performed.

The counter substrate 50 is bonded to the TFT substrate 20, on which the organic EL display device 40 and the like are formed, with a surrounding sealing compound layer (not illustrated), while keeping a predetermined gap therebetween so that the reflection electrode 31 and the counter electrode 33 face with each other. Then, injecting the liquid crystal composition into the gap forms the above-mentioned liquid crystal layer 32. Followed is providing the above-mentioned circularly polarizing plate 34 on a surface of the counter substrate 50 that is opposite to the liquid crystal layer 32.

(Method for manufacturing TFT substrate and organic EL display device)

Next, processes for manufacturing the TFT substrate 20 and the organic EL display device 40 formed thereon will be described in detail below with reference to FIGS. 3A to 3G and FIGS. 4A to 4G.

Figure 3A:
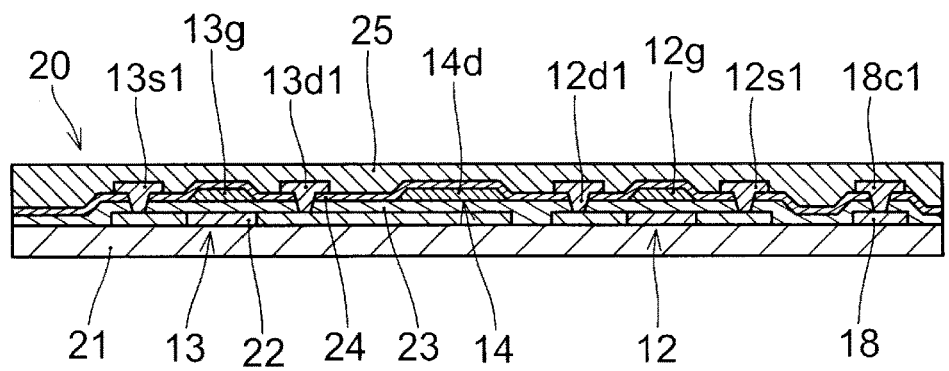
FIG. 3A is a cross-sectional view illustrating a manufacturing process of the display apparatus illustrated in FIG. 1.
Figure 4A:
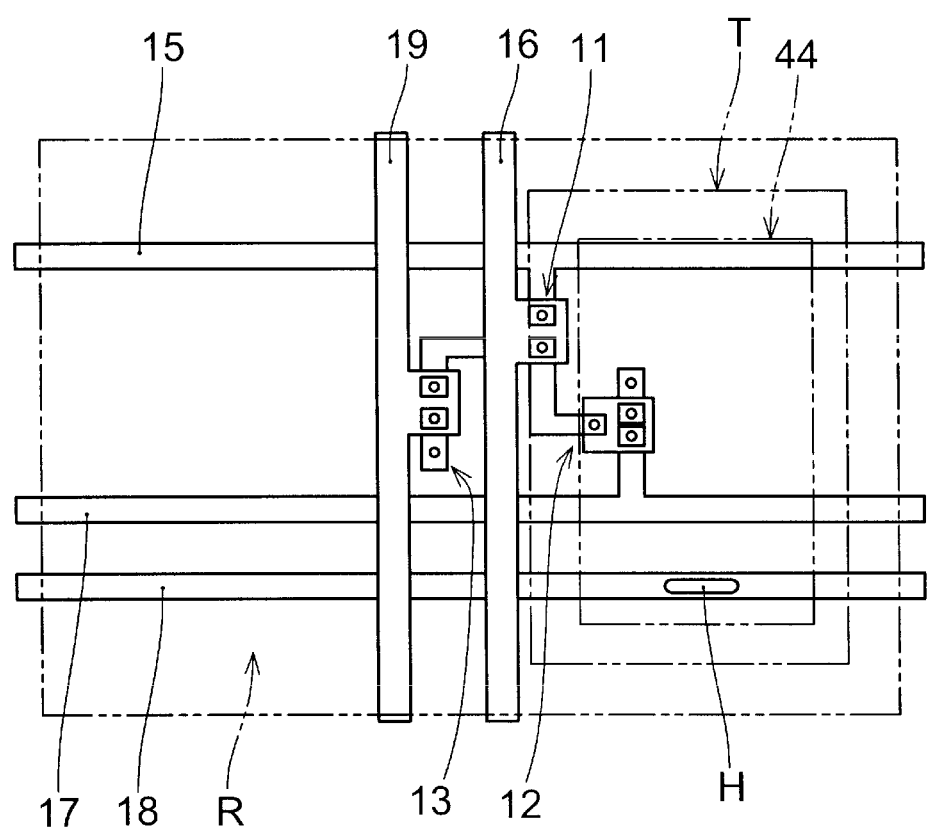
FIG. 4A is a plan view illustrating a manufacturing process of the display apparatus illustrated in FIG. 1.

First, as illustrated in FIG. 3A, the manufacturing includes forming a semiconductor layer 22 and the cathode bus line 18 on the insulation substrate 21, and subsequently forming a gate insulating film 23 made of $SiO_2$. The manufacturing further includes doping predetermined regions of the semiconductor layer 22 with impurities to form a source 13s and the drain 13d (see FIG. 1A) of the switching TFT 13 and a drain 12d and a source 12s (see FIG. 1A) of the current supply TFT 12. The manufacturing further includes forming a gate electrode 13g of the switching TFT 13, a gate electrode 12g of the current supply TFT 12, and the electrode 14d of the auxiliary capacitance 14 on the gate insulating film 23, and then forming the passivation layer 24 made of $SiN_x$ on the surface thereof. The manufacturing further includes forming a source contact 13s1 and the drain contact 13d1 of the switching TFT 13, a source contact 12s1 and the drain contact 12d1 of the current supply TFT 12, and the cathode contact 18c1, and further forming the insulating layer 25 such as polyimide for flattening the surface thereof. The insulating layer 25 may be formed of an inorganic layer, such as SOG, as mentioned above. FIG. 4A is a plan view illustrating an exemplary arrangement of the TFTs and bus lines.

Figure 3B:
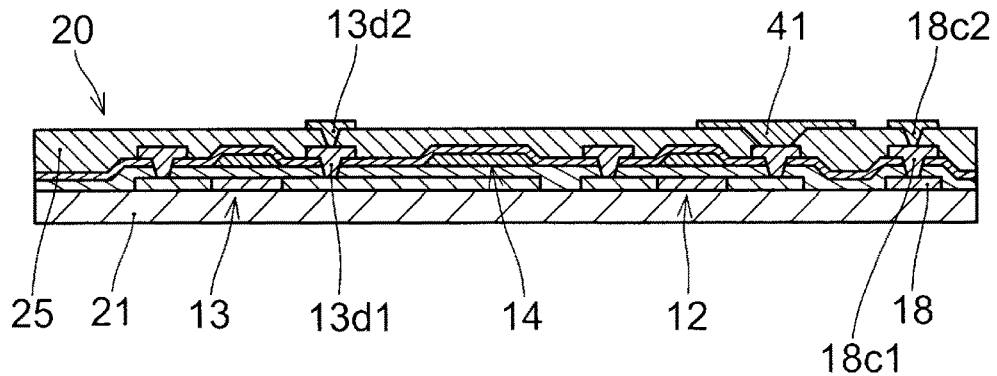
FIG. 3B is a cross-sectional view illustrating a manufacturing process of the display apparatus illustrated in FIG. 1.
Figure 4B:
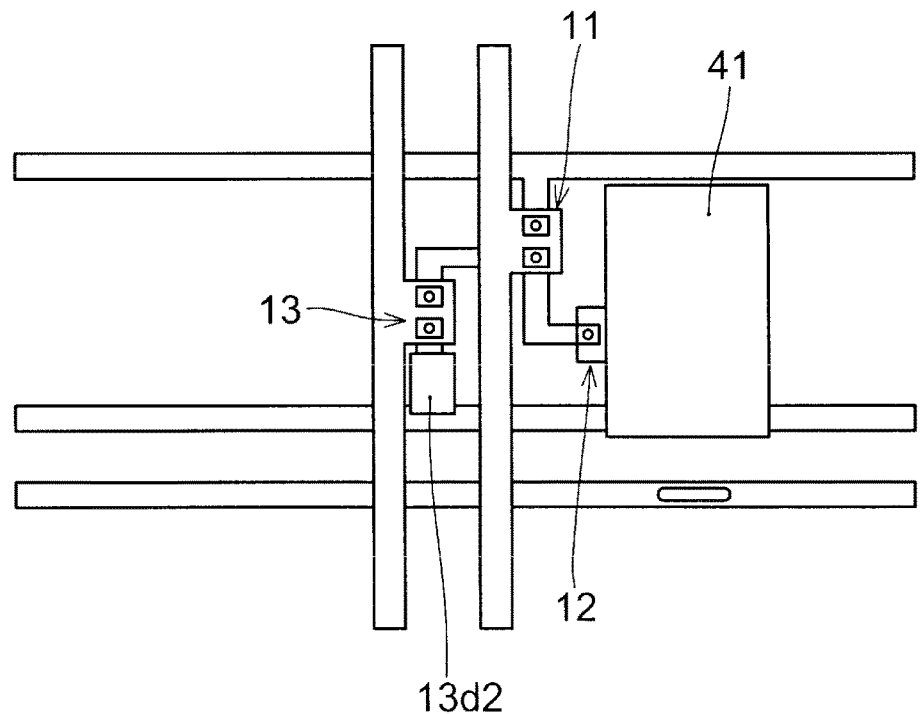
FIG. 4B is a plan view illustrating a manufacturing process of the display apparatus illustrated in FIG. 1.

Subsequently, as illustrated in FIG. 3B, the manufacturing further includes forming the contact 13d2 to be connected to the drain of the switching TFT 13 and the first electrode 41 of the organic EL display device 40 on the surface of insulating layer. The contact 13d2 for liquid crystal is formed by forming a contact hole and embedding an electrically conducting material in the contact hole can provide. However, the first electrode (anode electrode) for the organic EL display device is related to the organic layer 43, as mentioned above, and may be formed of multi-layers of ITO/APC(Ag—Pd—Cu alloy)/ITO. FIG. 4B is a plan view illustrating this step.

Figure 3C:
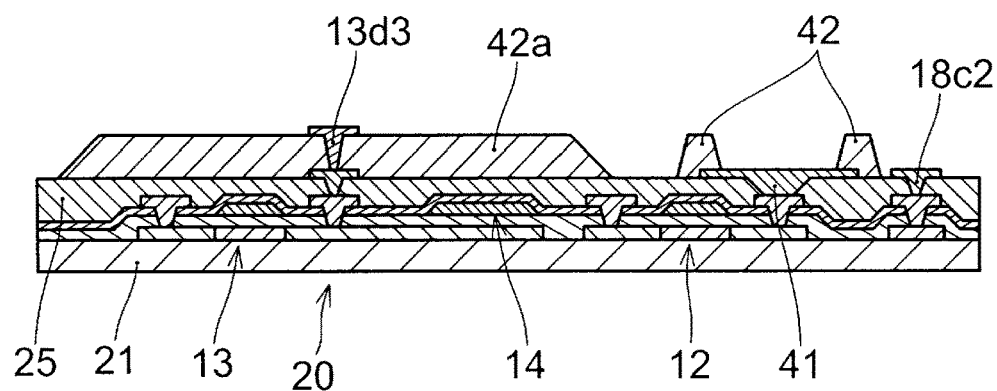
FIG. 3C is a cross-sectional view illustrating a manufacturing process of the display apparatus illustrated in FIG. 1.

Subsequently, as illustrated in FIG. 3C, the manufacturing further includes forming the second insulating layer 42 made of polyimide, acrylic resin, or the like. The second insulating layer 42 has the role of partitioning each pixel of the organic EL display device 40 and is therefore formed in such a way as to have a protruding portion surrounding the first electrode 41. The second insulating layer 42 is formed by using the above-mentioned resin. Accordingly, the formation of the second insulating layer 42 includes applying a liquid resin material on the entire surface and subsequently patterning a desired shape at a desired position. In the present embodiment, the liquid resin material is applied on the entire surface of the TFT substrate 20 so as to have a thickness comparable to the height of the protruding portion around the first electrode 41, and the patterning is performed in such a way as to expose the first electrode 41 and a boundary between the second insulating layer 42 and the third insulating layer 42a. In this case, although the third insulating layer 42a is formed in the first region R, the second insulating layer 42 and the third insulating layer 42a are separated from each other so that the third insulating layer 42a encompasses the contact 13d3 to be connected to the pixel electrode 31 in the first region R, and the insulating layer 25 is exposed between the separated insulating layers 42 and 42a. As mentioned above, completely covering the organic layer 43 and the second electrode 44 of the organic EL display device 40 with the coating layer 45 to be formed thereon is intended.

Figure 4C:
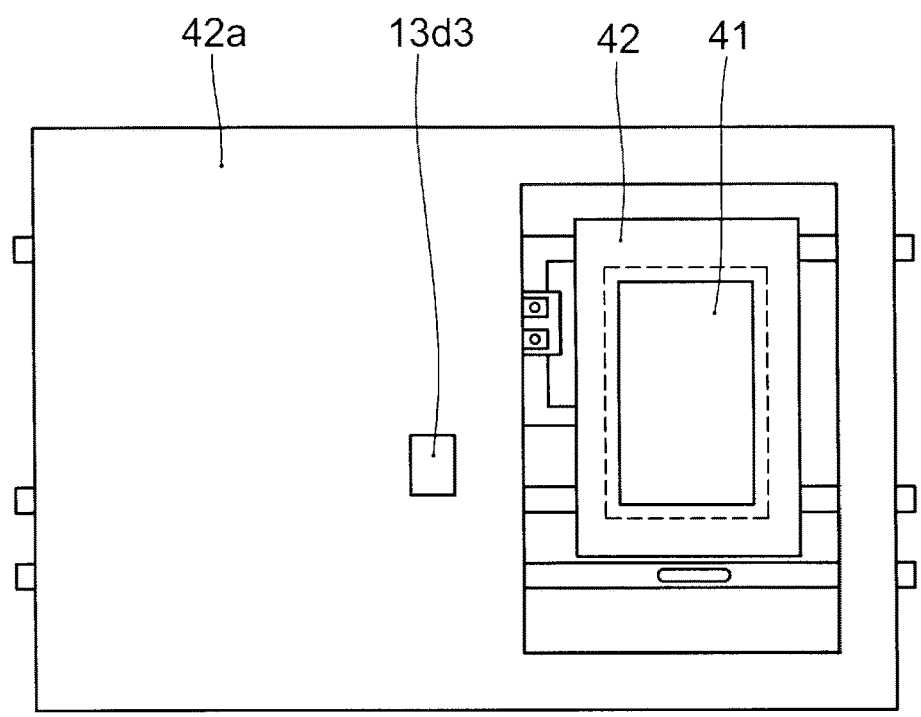
FIG. 4C is a plan view illustrating a manufacturing process of the display apparatus illustrated in FIG. 1.

The patterning of the second insulating layer 42 includes forming a contact hole for connection with the contact 13d2 of the first region R and forming the third contact 13d3 in the contact hole. FIG. 4C illustrates an exemplary arrangement of the second insulating layer 42 and the third insulating layer 42a, which are formed in such a manner that the second insulating layer 42 surrounds the first electrode 41 and the third insulating layer 42a is separated from the second insulating layer 42. As illustrated in the drawing, the third contact 13d3 connected to a drain 13d of the switching TFT 13 is exposed at a part of the third insulating layer 42a.

Figure 3D:
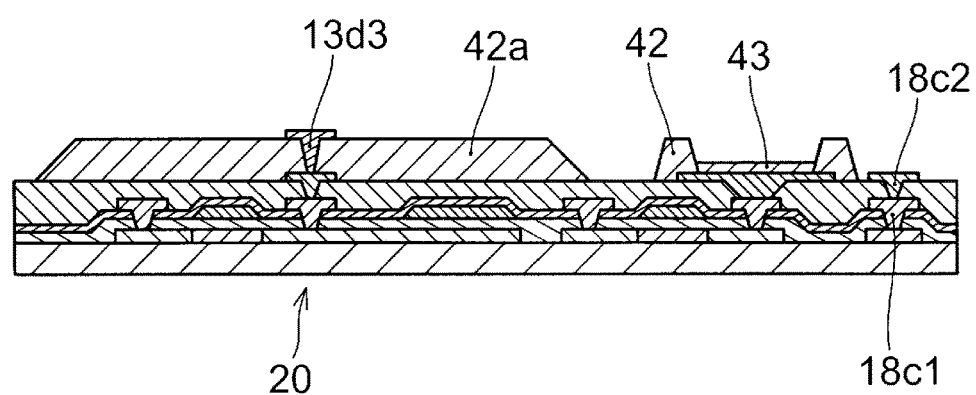
FIG. 3D is a cross-sectional view illustrating a manufacturing process of the display apparatus illustrated in FIG. 1.
Figure 4D:
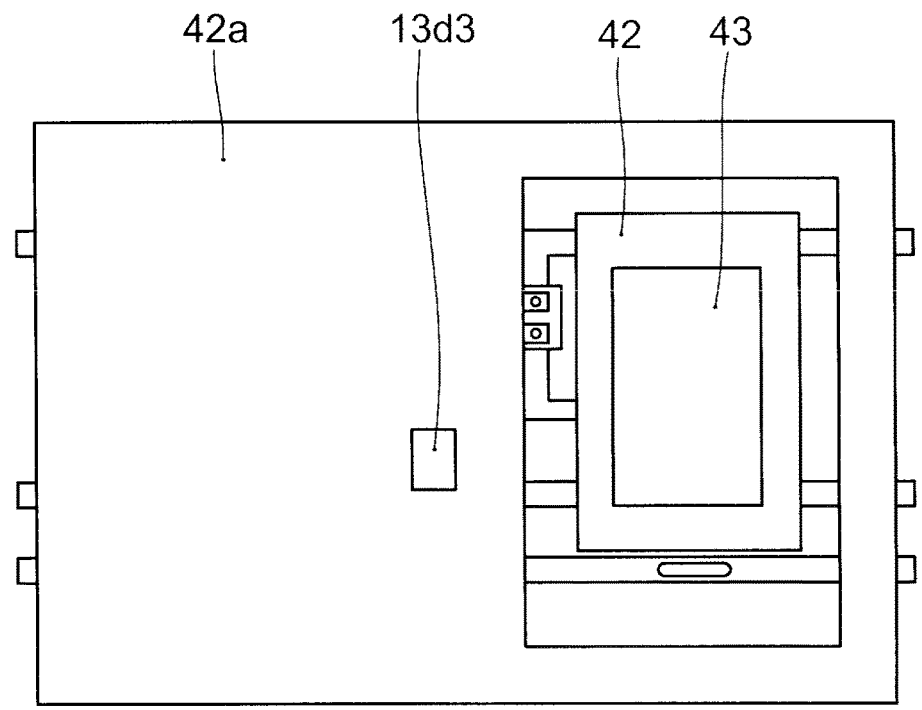
FIG. 4D is a plan view illustrating a manufacturing process of the display apparatus illustrated in FIG. 1.

Subsequently, as illustrated in FIGS. 3D and 4D, the manufacturing further includes forming the organic layer 43. The organic layer 43 is weak against moisture and oxygen and the patterning is unemployable. Therefore, a vapor-deposition mask for vapor-deposit only the required region is used. More specifically, the manufacturing includes positioning of an opening of the vapor-deposition mask so as to match with the protruding portion of the second insulating layer 42 illustrated in FIG. 3D, and depositing the sublimated or vaporized organic material from a crucible or the like only onto the first electrode 41 surrounded by the second insulating layer 42. As mentioned above, multi-layers made of various materials constitute the organic layer.

Figure 3E:
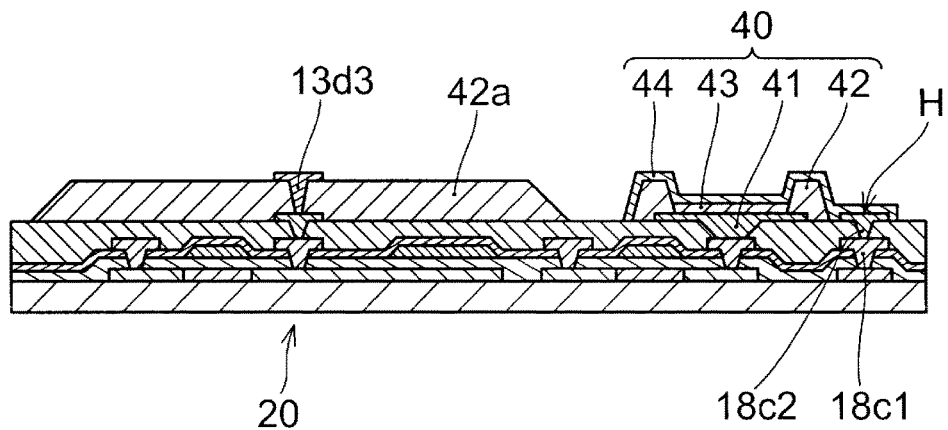
FIG. 3E is a cross-sectional view illustrating a manufacturing process of the display apparatus illustrated in FIG. 1.
Figure 4E:
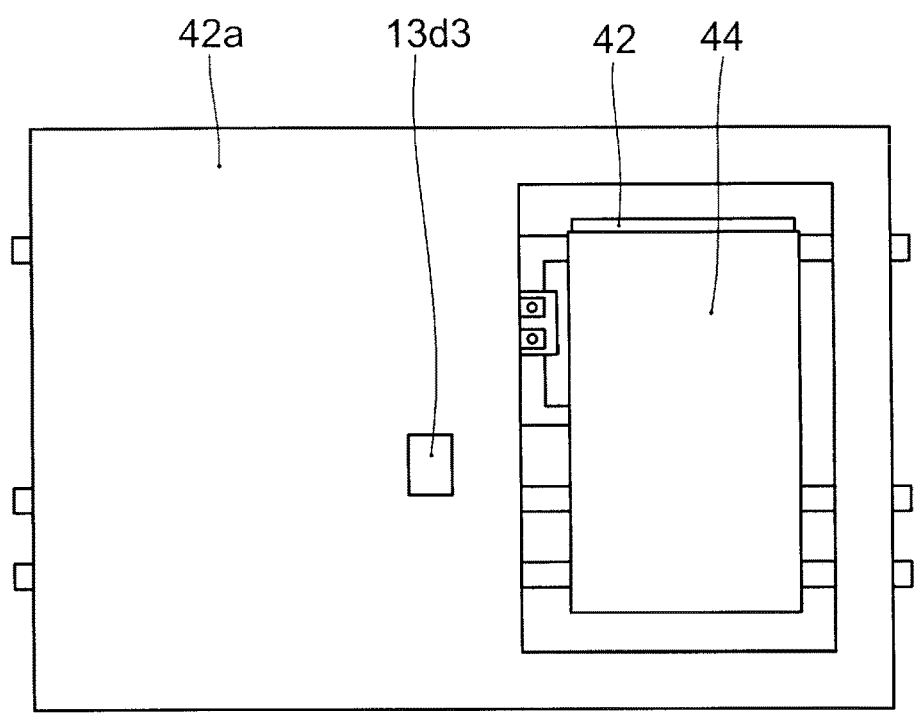
FIG. 4E is a plan view illustrating a manufacturing process of the display apparatus illustrated in FIG. 1.

Subsequently, as illustrated in FIGS. 3E and 4E, the manufacturing further includes forming the second electrode 44 serving as cathode electrode so as to cover substantially the entire surface of the organic EL display device 40, including the organic layer 43 and the protruding portion of the second insulating layer 42. The second electrode 44 is, for example, made of Mg—Ag alloy and can be formed by vapor-deposition using a vapor-deposition mask. The formation of the second electrode 44 may uncover a part of the second insulating layer 42 at one peripheral edge thereof and fully covers the second insulating layer 42 at another peripheral edge, as apparent from the plan view illustrated in FIG. 4E. In this case, a predetermined gap between the second electrode 44 and the third insulating layer 42a (in other words, a region of the insulating layer 25 exposed) is formed.

Figure 3F:
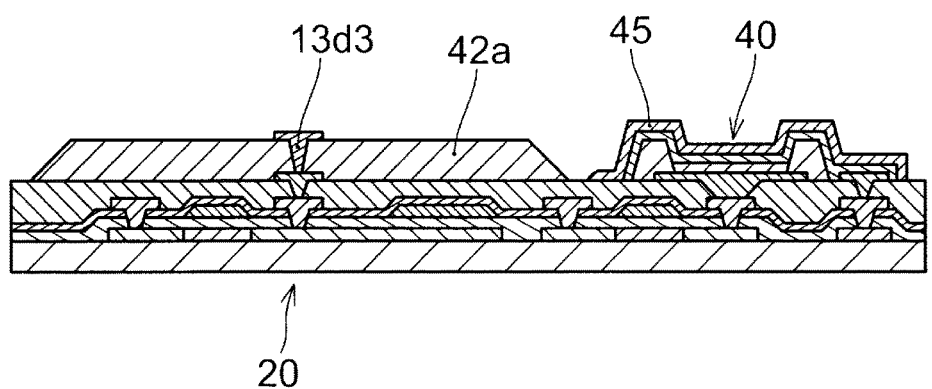
FIG. 3F is a cross-sectional view illustrating a manufacturing process of the display apparatus illustrated in FIG. 1.
Figure 4F:
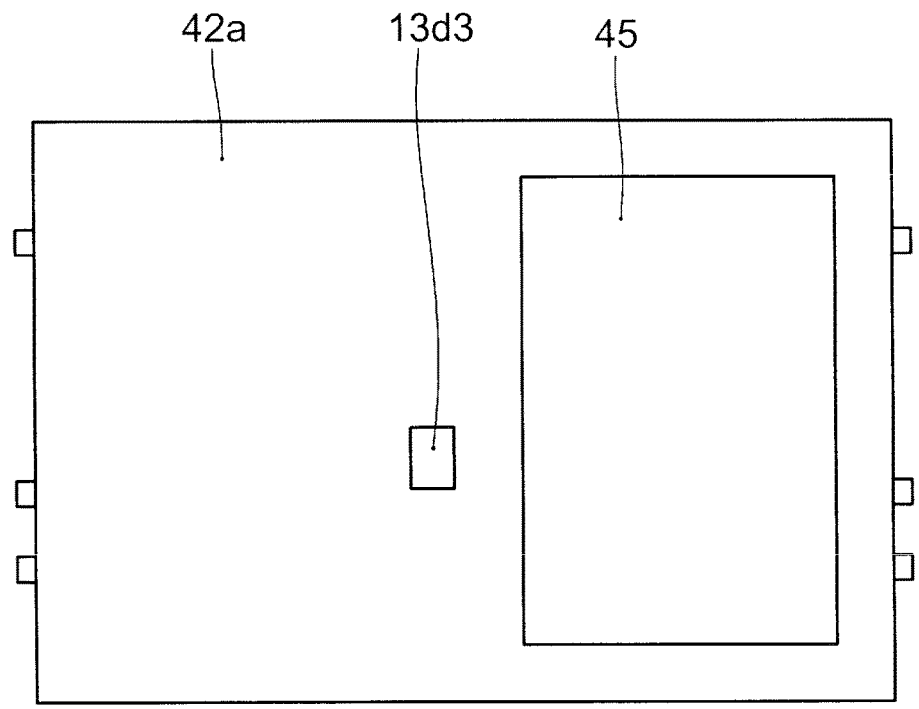
FIG. 4F is a plan view illustrating a manufacturing process of the display apparatus illustrated in FIG. 1.

Subsequently, as illustrated in FIGS. 3F and 4F, the manufacturing further includes forming the coating layer 45. The coating layer 45 has the role of protecting the organic layer 43 and the second electrode from moisture and oxygen and is formed of an inorganic layer, such as $SiN_x$ or $SiO_y$. In addition, in consideration of the possibility that the deposition may leave pinholes in the layer, forming the coating layer 45 as multi-layers constituted by two or more layers is desired. The CVD method, or atomic layer deposition (ALD) method, is employable to form the coating layer 45. Preferably, the coating layer 45 includes laminated multiple layers made of different materials. For example, the coating layer 45 is formed on the organic EL display device 40 as illustrated in FIG. 4F. However, the coating layer 45 may be formed to extend into the first region including the liquid crystal display device 30, unless it is formed on the contact 13d3. If the coating layer 45 is formed on the contact 13d3 requires, it causes to form a contact hole therein, and forming the contact hole induces the infiltration of moisture. And the moisture advances to the second electrode 44 along an inner surface of the coating layer 45 and the organic layer 43.

The coating layer 45 may be formed on the entire surface and then patterned by etching, in consideration of the fact that the coating layer 45 in contact with the insulating layer 25 prevents the infiltration of moisture. However, using a mask may be useful to deposit the coating layer 45 only at a desired portion. The latter is desired from the viewpoint of preventing the infiltration of moisture. In the case of partly embedding the coating layer 45 in the trench formed in the insulating layer 25 as illustrated in FIG. 1B, patterning the second insulating layer 42 beforehand as illustrated in FIG. 3C and forming the trench by etching the insulating layer 25 and subsequently forming the coating layer 45 can embed a part of the coating layer 45 in the trench. Setting the depth of the trench to be formed in the insulating layer 25 so as to expose the underlying inorganic insulating layer or metal layer, such as the passivation layer 24 or the contact 12d1, is desired. This is because the coating layer 45 is an inorganic insulating layer as mentioned above, and bringing the inorganic layers into contact with each other can obtain strong contact.

Figure 3G:
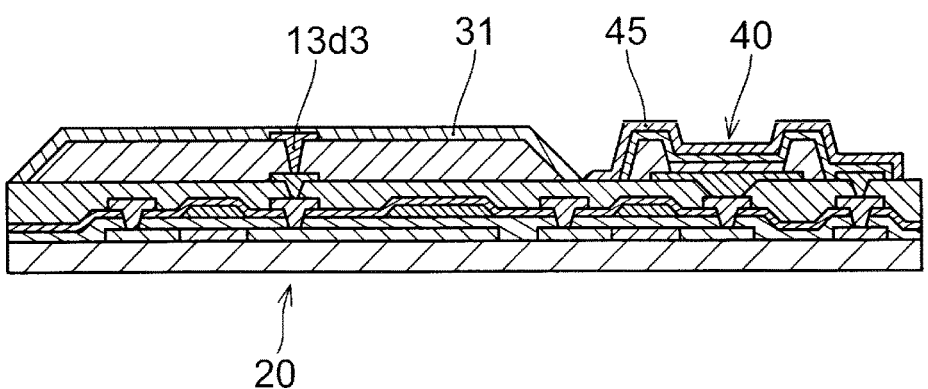
FIG. 3G is a cross-sectional view illustrating a manufacturing process of the display apparatus illustrated in FIG. 1.
Figure 4G:
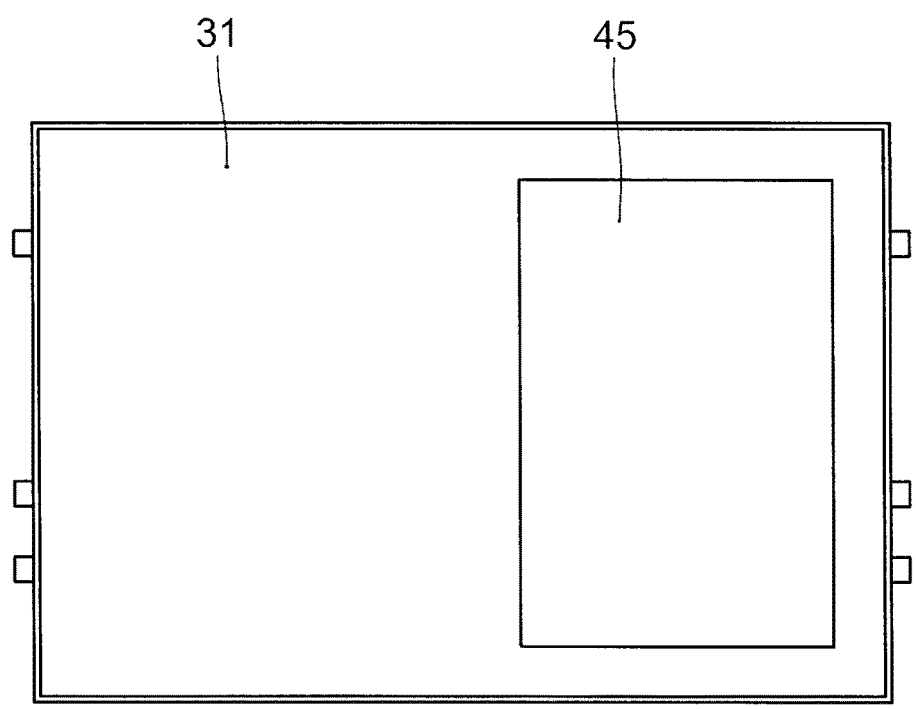
FIG. 4G is a plan view illustrating a manufacturing process of the display apparatus illustrated in FIG. 1.

Subsequently, as illustrated in FIGS. 3G and 4G, the manufacturing further includes forming the reflection electrode (pixel electrode) 31 for the liquid crystal display device 30 on the surface of the third insulating layer 42a in the first region R. This brings the reflection electrode 31 into electrical connection with the contact 13d3. The reflection electrode 31 can be made of, for example, Al and IZO. The reflection electrode 31 is also formed on substantially the entire area of one pixel, except for the entire area of the organic EL display device 40. Even in this case, patterning a reflection layer formed on the entire surface by vapor-deposition or the like is performed, because the coating layer 45 completely covers the organic layer 43 and the like. However, using a mask may be useful to form the reflection electrode 31 in only a desired region. In this manner, formation of various devices on the TFT substrate 20 side in the first region R and the second region T completes. Subsequently, although not illustrated, a liquid crystal alignment layer is formed on the entire surface thereof.

On the other hand, on the counter substrate 50 side, the translucent counter electrode 33 is formed on the insulation substrate 51 such as a glass plate or a resin film, although the color filter 35 or a liquid crystal alignment layer (not illustrated) is additionally laminated if necessary, as illustrated in FIG. 1A. The polarizing plate 34 is provided on a surface of the insulation substrate 51, which is opposite to the counter electrode 33. When the polarizing plate 34 is configured as a circularly polarizing plate, a quarter-wavelength retardation plate and a linearly polarizing plate are laminated on the insulation substrate.

Then, the counter substrate 50 is boded to the TFT substrate 20, on which the organic EL display device 40 and the like are formed, with a surrounding sealing compound layer, while keeping a predetermined gap therebetween so that their electrodes face each other. The liquid crystal composition is injected into the gap to form the liquid crystal layer 32. As a result, a display apparatus including pixels, each of which includes the reflective liquid crystal display device 30 in the first region where the reflection electrode 31 is formed and the organic EL display device 40 formed in the second region T, can be obtained.

(Operation of Display Apparatus)

In the above-mentioned display apparatus, when external light is bright, the switching TFT 13 is turned on in response to a signal sent to the second gate bus line 19 and the driving TFT 11 is selected in response to both the selection signal supplied to the gate bus line 16 and the data signal supplied to the source bus line 15, thereby causing the liquid crystal display device 30 in the first region R to display an image according to the data signal supplied to the source bus line 15. On the other hand, at nighttime or a dark place such as indoors, no signal is supplied to the second gate bus line 19 and therefore the switching TFT 13 is turned off. At the same time, the current bus line 17 is connected and, if the driving TFT 11 selects this pixel, the current supply TFT 12 is turned on to control lighting of the organic EL display device 40 in response to the data signal supplied to the source bus line 15, thereby displaying an image on the entire screen.

As mentioned above, the display apparatus according to the present embodiment can operate as a reflective liquid crystal display device during the daytime or when external light is sufficient, and can display an image by using an organic EL display device which is consume less electric power when the external light is insufficient. As a result, the obtained display apparatus is less in both consumed power and battery consumption. Therefore, the display apparatus according the present embodiment is conveniently usable as a portable telephone, a personal digital assistant (PDA), or any other portable equipment.

Usually, the area available for display is approximately 80% of the entire display area, since spaces between pixels are not available. The area of the organic layer 43 (inside of the second insulating layer 42) is inevitably reduced to approximately 30% or less in the case of depositing the organic layer according to the vapor-deposition method, and the remaining 50% is available as the reflection display region R. In this case, the reflectance of the reflection display portion is approximately 8%. When the illuminance of external light is 30,000 lux (cloudy sky), the luminance of the reflection display portion is 800 cd/m$^2$, which ensures sufficiently bright display.

In general, the luminance of the light emitting device 40 is approximately 500 cd/m$^2$, from the reason for assuring visibility under external light. In the present embodiment, by the effect of the reflection display portion, there is no need to obtain such higher luminance. Further, there is an advantage that an organic EL material emphasizing reliability rather than luminance can be selectable.

CONCLUSION (1) A display apparatus according to an embodiment of the disclosure includes a TFT substrate including an insulating layer (flattening layer) formed on a driving element; a liquid crystal layer including a liquid crystal composition; a counter substrate provided with a transparent electrode facing the TFT substrate via the liquid crystal layer; and a polarizing plate provided on a surface of the counter substrate, the surface being opposite to the liquid crystal layer, wherein the display apparatus includes a plurality of pixels, each of the plurality of pixels including a first region and a second region, the first region and the second region being adjacent to each other, in a display region, the first region has a reflection electrode provided above the insulating layer of the TFT substrate, the second region has a light emitting device, the light emitting device being provided with a first electrode, an organic layer, and a second electrode are in order on the insulating layer of the TFT substrate, the light emitting device further includes a coating layer covering entirely a light emitting region of each pixel, and wherein a border part of the coating layer is in contact with the insulating layer.

According to the present embodiment, the coating layer is formed in such a way as to wrap the organic layer and the second electrode of the organic EL display device, while excluding a portion where the contact hole or the like is formed. In addition, the coating layer is partly in contact with the flattening layer or the inorganic layer. Therefore, the infiltration of moisture or oxygen can be completely prevented. As a result, the organic layer does not deteriorate. Accordingly, the output or any other characteristics of the organic EL display device do not deteriorate for a longer period of time. The organic EL display device can assure high reliability.

(2) The TFT substrate further comprises a second insulating layer partitioning the light emitting region of the light emitting device, the second insulating layer being disposed on the insulating layer so as to extend into the first region, and the second insulating layer is separated between the first region and the second region. Such an arrangement can substantially equalize the height of multi-layers between the first region R and the second region T. As a result, the thickness of the liquid crystal layer disposed thereon substantially becomes uniform, and the characteristics of the liquid crystal layer can be maintained adequately. On the other hand, since the third insulating layer in the first region is separated from the bank layer in the second region, the coating layer can easily and completely cover the organic layer side.

(3) The border part of the coating layer is embedded in a groove formed in the insulating layer. By such an arrangement the infiltration path of moisture becomes longer and the possibility of infiltrating moisture via the contact surface can be reduced.

(4) Preferably, the border part of the coating layer is in contact with a metal layer or an inorganic insulating layer underlying the insulating layer. Bringing inorganic layers into contact with each other can maintain very strong contact.

(5) Preferably, the groove formed in the insulating layer is positioned on a contact of the TFT substrate, or at a flat portion of a passivation layer formed on the driving element, because contact between the coating layer and the inorganic layer can be certainly obtained.

(6) Preferably, the insulating layer is made from an inorganic layer, and the coating layer is in contact with a surface of the insulating layer. This is because, even if no groove is formed and partly embedding the coating layer is infeasible, the coating layer and the flattening layer can be in contact each other with very good adhesion.

(7) Preferably, a switching TFT for switching between a display in the first region and a display in the second region is formed on the TFT substrate. This is because performing each light emission (display) without causing any interference is feasible.

(8) Preferably, the alignment of the liquid crystal layer is normally black, and the polarizing plate is a circularly polarizing plate and is also formed in the second region. This is because the circularly polarizing plate can cut off reflected light of external light in the second region.

(9) Preferably, the TFT substrate includes a first liquid crystal alignment layer on a surface facing the liquid crystal layer, the counter substrate includes a second liquid crystal alignment layer on a surface facing the liquid crystal layer, and liquid crystal molecules of the liquid crystal layer are aligned substantially vertically in the vicinity of the TFT substrate, and has a pretilt with respect to the surface of the counter substrate. This is because, in the case of normally black, the presence of the liquid crystal layer intervening on the organic EL display device side has no substantial influence on light emission of the organic EL display device.

(10) Preferably, the pretilt is an angle in a range from 80° to 89.9° with respect to the surface of the counter substrate, because the transition to the horizontal alignment becomes smooth.

REFERENCE SIGNS LIST 11 driving TFT
12 current supply TFT
13 switching TFT
14 auxiliary capacitance
15 source bus line
16 gate bus line
17 current bus line
18 cathode bus line
19 second gate bus line 20 TFT substrate
21 insulation substrate
22 semiconductor layer
23 gate insulating film
24 passivation layer
25 insulating layer (flattening layer)
30 liquid crystal display element
31 reflection electrode (pixel electrode)
32 liquid crystal layer
33 counter electrode
34 polarizing plate
35 color filter
40 organic EL display device
41 first electrode
42 second insulating layer
42a third insulating layer
43 organic layer
44 second electrode
45 coating layer
50 counter substrate
51 insulation substrate
R first region
T second region

The invention claimed is:

1. A display apparatus comprising:
   a TFT substrate including an insulating layer formed on a driving element;
   a liquid crystal layer including a liquid crystal composition;
   a counter substrate provided with a transparent electrode facing the TFT substrate via the liquid crystal layer; and
   a polarizing plate provided on a surface of the counter substrate, the surface being opposite to the liquid crystal layer,
   wherein the display apparatus includes a plurality of pixels, each of the plurality of pixels including a first region and a second region, the first region and the second region being adjacent to each other, in a display region,
   the first region has a reflection electrode provided above the insulating layer of the TFT substrate,
   the second region has a light emitting device, the light emitting device being provided with a first electrode, an organic layer, and a second electrode are in order on the insulating layer of the TFT substrate,
   the light emitting device further includes a coating layer covering entirely a light emitting region of each pixel, and
   wherein a border part of the coating layer is in contact with the insulating layer,
   wherein the TFT substrate further comprises a second insulating layer partitioning the light emitting region of the light emitting device,
   the second insulating layer being disposed on the insulating layer so as to extend into the first region, and
   the second insulating layer is separated between the first region and the second region.

2. The display apparatus according to claim 1, wherein the border part of the coating layer is embedded in a groove formed in the insulating layer.

3. The display apparatus according to claim 2, wherein the border part of the coating layer is in contact with an inorganic layer underlying the insulating layer.

4. The display apparatus according to claim 2, wherein the groove formed in the insulating layer is positioned on a contact of the TFT substrate, or at a flat portion of a passivation layer formed on the driving element.

5. The display apparatus according to claim 1, wherein the insulating layer is made from an inorganic layer, and the coating layer is in contact with a surface of the insulating layer.

6. The display apparatus according to claim 1, wherein a switching TFT for switching between a display in the first region and a display in the second region is formed on the TFT substrate.

7. The display apparatus according to claim 1, wherein the alignment of the liquid crystal layer is normally black, and the polarizing plate is a circularly polarizing plate and is also formed in the second region.

8. The display apparatus according to claim 1, wherein the TFT substrate includes a first liquid crystal alignment layer on a surface facing the liquid crystal layer,
   the counter substrate includes a second liquid crystal alignment layer on a surface facing the liquid crystal layer, and
   liquid crystal molecules of the liquid crystal layer are aligned substantially vertically in the vicinity of the TFT substrate, and has a pretilt with respect to the surface of the counter substrate.

9. The display apparatus according to claim 8, wherein the pretilt is an angle in a range from 80° to 89.9° with respect to the surface of the counter substrate.

* * * * *